(12) United States Patent
Hong et al.

(10) Patent No.: US 11,075,185 B2
(45) Date of Patent: Jul. 27, 2021

(54) SEMICONDUCTOR PACKAGE WITH MULTI-LEVEL CONDUCTIVE CLIP FOR TOP SIDE COOLING

(71) Applicant: Infineon Technologies AG, Neubiberg (DE)

(72) Inventors: Chii Shang Hong, Melaka (MY); Ivan Nikitin, Regensburg (DE); Wei Han Koo, Melaka (MY); Chiew Li Tai, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/575,006

(22) Filed: Sep. 18, 2019

(65) Prior Publication Data

US 2020/0350272 A1  Nov. 5, 2020

Related U.S. Application Data

(63) Continuation-in-part of application No. 16/402,486, filed on May 3, 2019.

(51) Int. Cl.
*H01L 23/00* (2006.01)
*H01L 21/56* (2006.01)
*H01L 23/367* (2006.01)
*H01L 23/31* (2006.01)

(52) U.S. Cl.
CPC ............ *H01L 24/40* (2013.01); *H01L 21/565* (2013.01); *H01L 23/3178* (2013.01); *H01L 23/367* (2013.01); *H01L 24/09* (2013.01)

(58) Field of Classification Search
CPC combination set(s) only.
See application file for complete search history.

(56) References Cited

U.S. PATENT DOCUMENTS 5,616,957 A * 4/1997 Kajihara ............ H01L 23/4334
257/712
9,165,855 B1  10/2015 Yow et al.
(Continued)

OTHER PUBLICATIONS

Abd Hamid, Syahir, et al., "Selective Plating of Semiconductor Package Leads", U.S. Appl. No. 16/036,354, filed Jul. 16, 2018, 1-30.
(Continued)

*Primary Examiner* — Nduka E Ojeh
(74) *Attorney, Agent, or Firm* — Murphy, Bilak & Homiller, PLLC

(57) ABSTRACT

A semiconductor package includes a die pad having a die attach surface, a semiconductor die mounted on the die attach surface and having a first bond pad at an upper surface facing away from the die attach surface, an interconnect clip including a first segment which at least partially encloses a central opening, a second segment vertically offset and spaced apart from the first segment, and a support extending between the first segment and the second segment. The package further includes an electrically insulating encapsulant covering the semiconductor die. An upper surface of the first segment of the interconnect clip is exposed from a planar surface of the encapsulant. A lower surface of the second segment is flush against the upper surface of the semiconductor die and conductively connected to the first bond pad.

16 Claims, 11 Drawing Sheets

(56) References Cited

U.S. PATENT DOCUMENTS

| | | | | |
|---|---|---|---|---|
| 2005/0104195 A1* | 5/2005 | Yang | ............... | H01L 23/3128 |
| | | | | 257/706 |
| 2007/0278632 A1* | 12/2007 | Zhao | ............. | H01L 24/97 |
| | | | | 257/676 |
| 2008/0087992 A1* | 4/2008 | Shi | ............... | H01L 23/49524 |
| | | | | 257/670 |
| 2009/0039485 A1* | 2/2009 | Lee | ............... | H01L 23/3128 |
| | | | | 257/676 |
| 2013/0037931 A1* | 2/2013 | Higgins, III | ......... | H01L 21/565 |
| | | | | 257/712 |
| 2013/0221511 A1* | 8/2013 | Higgins, III | ........ | H01L 23/4334 |
| | | | | 257/690 |
| 2014/0191334 A1* | 7/2014 | Xue | ............. | H01L 24/41 |
| | | | | 257/401 |
| 2018/0040541 A1 | 2/2018 | Choi et al. | | |

OTHER PUBLICATIONS

Hong, Chii Shang, et al., "Wire Bonded Package with Single Piece Exposed Heat Slug and Leads", U.S. Appl. No. 15/983,621, filed May 18, 2018, 1-44.

\* cited by examiner

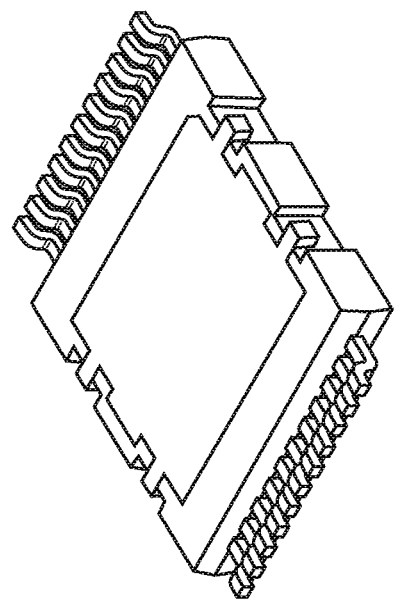
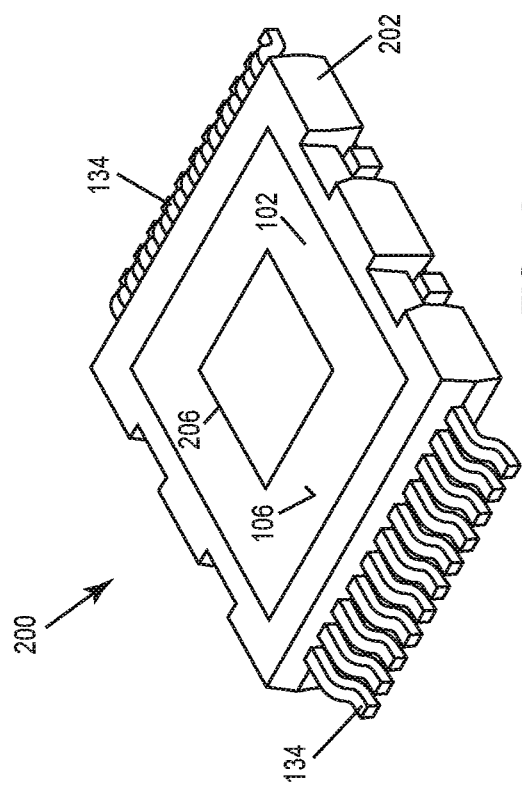
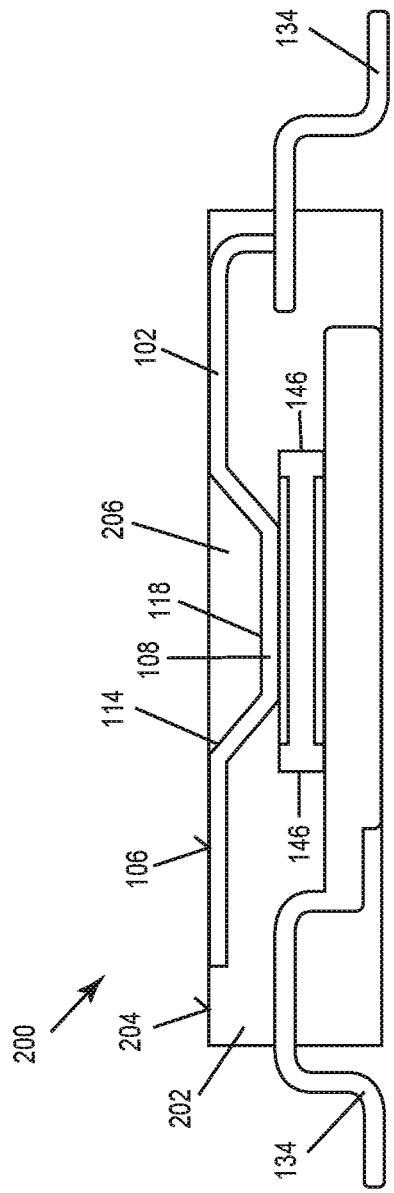
FIGURE 5

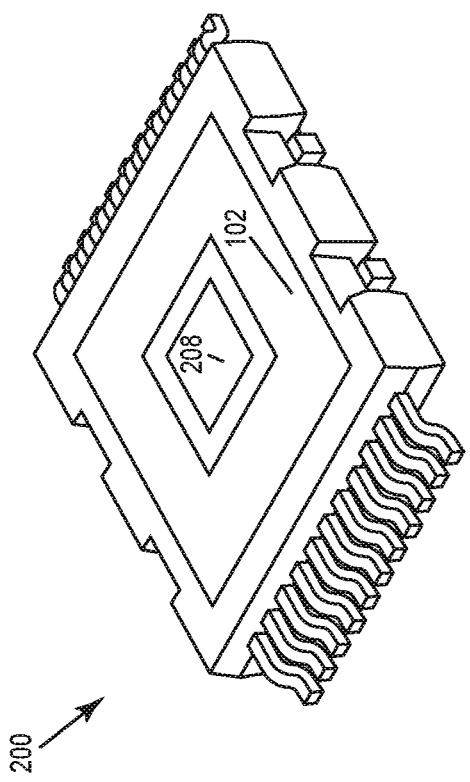
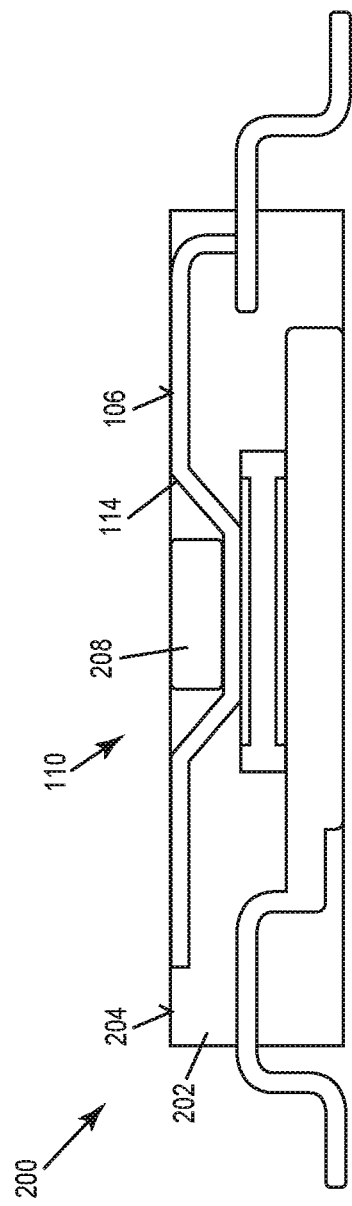
FIG. 6A
FIG. 6B
FIGURE 6

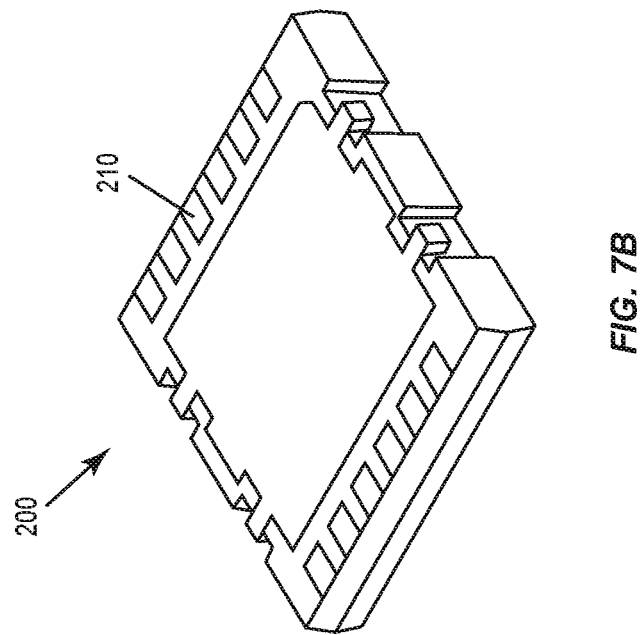
*FIG. 7B*
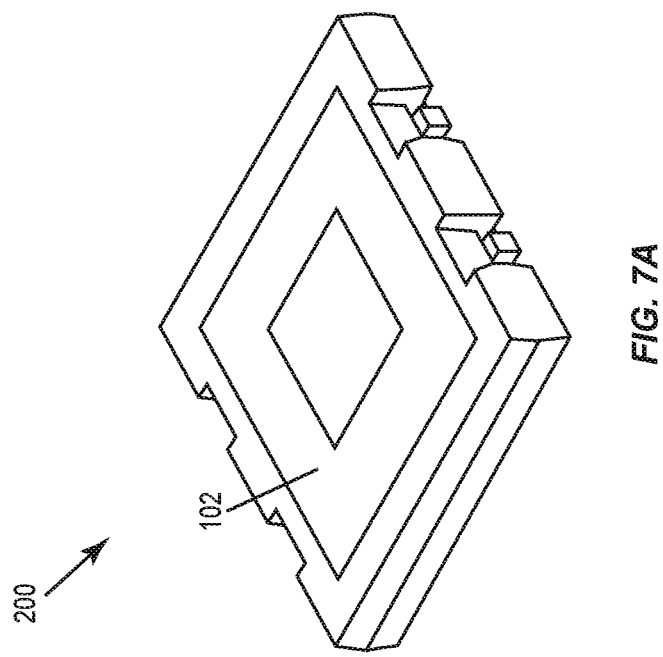
*FIG. 7A*
*FIGURE 7*

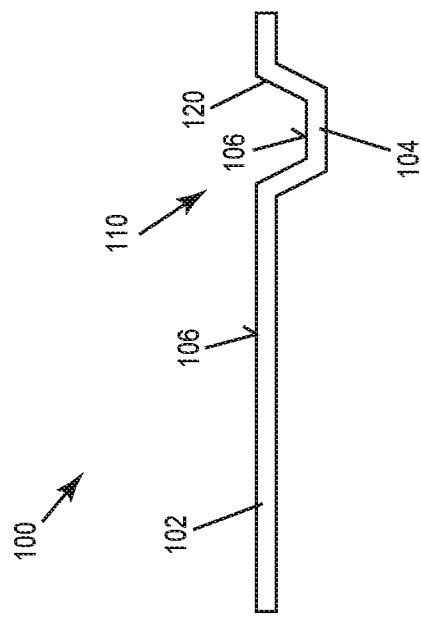
FIG. 8B
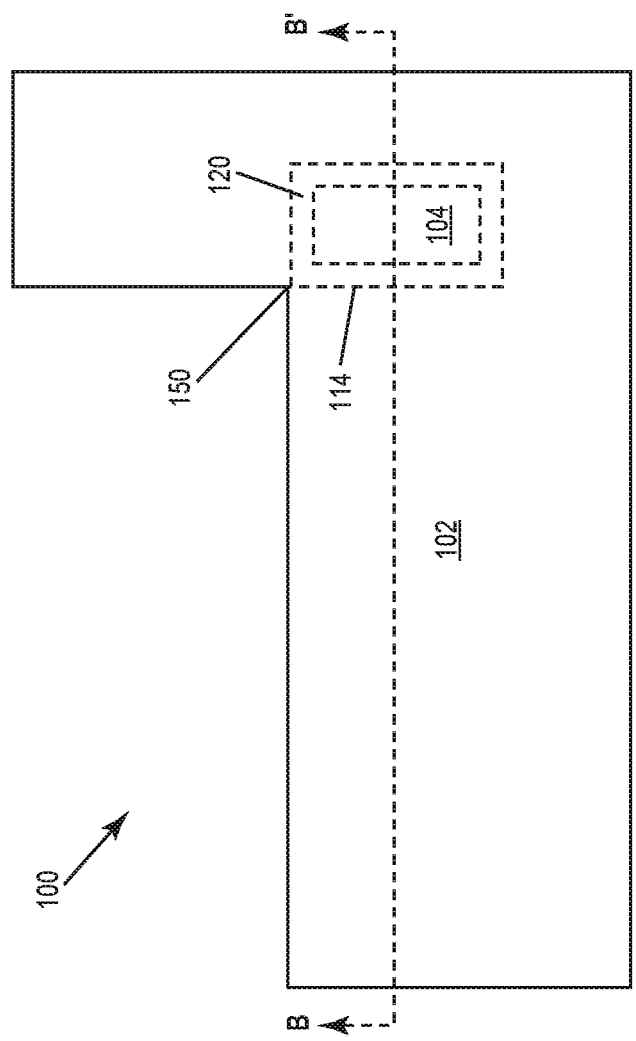
FIG. 8A
FIGURE 8

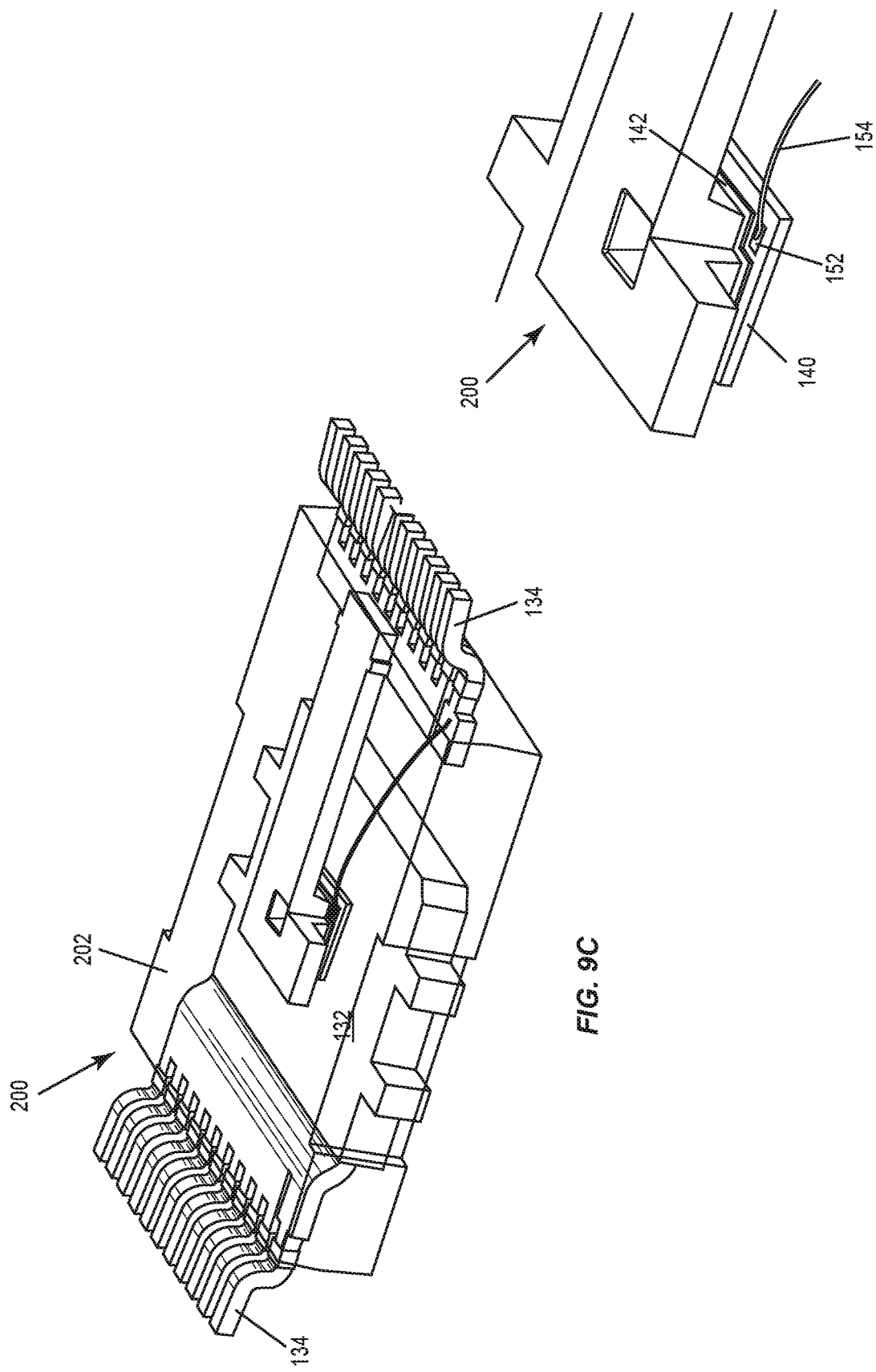

SEMICONDUCTOR PACKAGE WITH MULTI-LEVEL CONDUCTIVE CLIP FOR TOP SIDE COOLING

RELATED APPLICATIONS

The present application is a continuation in part of U.S. application Ser. No. 16/402,486 filed on May 3, 2019, the content of which is incorporated by reference herein in its entirety.

TECHNICAL FIELD

Embodiments of this invention generally relate to semiconductor packages and more particularly relate to cooling and interconnect features of semiconductor packages.

BACKGROUND

Semiconductor packages are designed to provide connective compatibility between a semiconductor die and an external apparatus, such as a printed circuit board (PCB), and to protect the semiconductor die from potentially damaging environmental conditions, such as temperature variations, moisture, dust particles, etc. An important design consideration in many semiconductor packages is the cooling capability of the package. Many semiconductor dies generate a substantial amount of heat during typical operation. One example of such a device is a power semiconductor device that is required to block substantially large voltages, e.g., 200 volts or more, during normal operation. Cooling features are often needed to ensure that semiconductor dies operate within safe temperature ranges.

Bottom side cooling configured packages are designed to draw heat away from the semiconductor die towards a bottom side of the package. In one example of this configuration, the semiconductor die is mounted on a metal substrate with a load terminal (e.g., source, anode, etc.) facing the metal substrate. A lower surface of the metal substrate is exposed at a bottom side of the package. The package can be mounted on a circuit board such and mated with a heat sink that draws heat away from the package substrate during operation.

Dual side cooling packages seek to provide improved thermal dissipation capacity in comparison to bottom side cooling configured packages. A dual side cooling package includes features that provide a conductive path between the bottom side of the die and the lower side of the package (e.g., as described above), and the upper side of the die and the upper side of the package. A dual side cooling package can be mounted on a circuit board with a second heat sink mounted on top of the package to extract heat away from the upper side of the package. Generally speaking, dual side cooling packages should preferably extract heat away from the semiconductor die relatively evenly in both directions, i.e., towards the bottom side and towards the top side. However, known top-side cooling features do not achieve this balance. Moreover, they require costly and time-consuming processing steps, e.g., soldering, welding, etc., are required to incorporate known top-side cooling features into a semiconductor package.

SUMMARY

A semiconductor package is disclosed. According to an embodiment, the semiconductor package comprises a die pad comprising a die attach surface, a semiconductor die mounted on the die attach surface and comprising a first bond pad at an upper surface facing away from the die attach surface, an interconnect clip, comprising a first segment which at least partially encloses a central opening, a second segment vertically offset and spaced apart from the first segment, and one or more supports connected between the first segment and the second segment, and an electrically insulating encapsulant covering the semiconductor die. An upper surface of the first segment of the interconnect clip is exposed from an upper surface of the encapsulant. A lower surface of the second segment is flush against the first bond pad.

Separately or in combination, the upper surface of the first segment that is exposed from the upper surface of the encapsulant laterally extends past outer edge sides of the semiconductor die in every direction.

Separately or in combination, a central portion of the encapsulant directly interfaces with interior edge sides of the first segment and extends to the upper surface of the encapsulant.

Separately or in combination, the semiconductor package further comprises a metal heat slug attached to an upper surface of the second segment and extending to the upper surface of the encapsulant, wherein the central portion of the encapsulant fills a region between the heat slug and the interior edge sides of the first segment.

Separately or in combination, the first segment forms a closed shape around the central opening.

Separately or in combination, the semiconductor package further comprises a first lead that is spaced apart from the die pad, and the interconnect clip electrically connects the first bond pad to the first lead.

Separately or in combination, the interconnect clip further comprises an end connector extending from the first segment towards the first lead, and an outer end of the end connector directly electrically contacts the first lead.

Separately or in combination, connection points between the supports and the first segment are laterally offset from the connection points between the supports and the second segment.

Separately or in combination, each of the supports extend diagonally from outer edge sides of the second segment and inner edge sides of the first segment that face the central opening.

Separately or in combination, the interconnect clip comprises two pairs of the supports, the supports of each pair extend away from one another in opposite directions, each of the supports are separated from one another by lateral gaps, and the encapsulant fills the lateral gaps.

Separately or in combination, the upper surface of the first segment and the lower surface of the second segment are substantially parallel to one another, and the upper surface of the first segment is substantially coplanar with the upper surface of the encapsulant.

Separately or in combination, the first segment, the second segment and the supports are monolithically formed portions of a planar sheet metal.

A method of packaging a semiconductor device is disclosed. According to an embodiment, the method comprises providing a die pad comprising a die attach surface, providing a semiconductor die comprising a first bond pad on an upper surface of the semiconductor die, mounting the semiconductor die on the die pad such that the first bond pad faces away from the die attach surface, providing an interconnect clip that comprises a first segment which at least partially encloses a central opening; a second segment vertically offset and spaced apart from the first segment, and one or more supports connected between the first segment and the second segment, mounting the interconnect clip on the semiconductor die such that a lower surface of the second segment is flush against the upper surface of the semiconductor die and conductively connected to the first bond pad, and forming an electrically insulating encapsulant such that the semiconductor die is covered by the encapsulant and such that an upper surface of the first segment of the interconnect clip is exposed from an upper surface of the encapsulant.

Separately or in combination, after forming the encapsulant, the upper surface of the first segment that is exposed from the upper surface of the encapsulant laterally extends past outer edge sides of the semiconductor die in every direction.

Separately or in combination, after forming the encapsulant, a central portion of the encapsulant directly interfaces with interior edge sides of the first segment and extends to the upper surface of the encapsulant.

Separately or in combination, the method further comprises providing a first lead that is spaced apart from the die pad and electrically connecting the first bond pad to the first lead using the interconnect clip.

Separately or in combination, the interconnect clip comprises a plurality of the supports, each of the supports are laterally separated by gaps, and liquified molding material flows through each of the gaps during the formation of the encapsulant.

Separately or in combination, the liquified molding material flowing through each of the gaps flows in a lateral direction that points towards the central opening Separately or in combination, providing the interconnect clip comprises selecting an area of the second segment to be correlated to an area of the semiconductor die.

Separately or in combination, providing the interconnect clip comprises providing a planar sheet of metal and forming a monolithic structure comprising the first segment, the second segment and the supports from the planar sheet of metal.

A semiconductor package is disclosed. According to an embodiment, the semiconductor package comprises a die pad comprising a die attach surface, a semiconductor die mounted on the die attach surface and comprising a first bond pad at an upper surface facing away from the die attach surface, and an interconnect clip. The interconnect clip comprises a first segment which at least partially encloses a central opening, a second segment vertically offset and spaced apart from the first segment, and a support extending between the first segment and the second segment. The semiconductor package further comprises an electrically insulating encapsulant covering the semiconductor die. An upper surface of the first segment of the interconnect clip is exposed from a planar surface of the encapsulant. A lower surface of the second segment is flush against the upper surface of the semiconductor die and conductively connected to the first bond pad.

Separately or in combination, the second segment is a planar pad with a closed shape geometry, and from a plan view perspective of the interconnect clip, the support wraps around a perimeter of the second segment.

Separately or in combination, the second segment has a rectangular geometry, and from the plan view perspective of the interconnect clip, the support wraps around at least one corner of the second segment.

Separately or in combination, the support forms a complete enclosed loop extending between the outer edge sides of the second segment and inner edge sides of the first segment which face the central opening.

Separately or in combination, from a plan view perspective of the interconnect clip, the interconnect clip has an L-shaped geometry, the semiconductor die further comprises a second bond pad at the upper surface, and the second bond is outside of a footprint of the interconnect clip.

A method of packaging a semiconductor device is disclosed. According to an embodiment the method comprises providing a die pad comprising a die attach surface, providing a semiconductor die comprising a first bond pad on an upper surface of the semiconductor die; mounting the semiconductor die on the die pad such that the first bond pad faces away from the die attach surface and providing an interconnect clip. The interconnect comprises a first segment which at least partially encloses a central opening, a second segment vertically offset and spaced apart from the first segment, and a support extending between the first segment and the second segment. The method further comprises mounting the interconnect clip on the semiconductor die such that a lower surface of the second segment is flush against the upper surface of the semiconductor die and conductively connected to the first bond pad, and forming an electrically insulating encapsulant such that the semiconductor die is covered by the encapsulant and such that an upper surface of the first segment of the interconnect clip is exposed from an upper surface of the encapsulant.

Separately or in combination, the second segment is a planar pad has a closed shape geometry, and from a plan view perspective of the interconnect clip, the second segment wraps around a perimeter of the second segment.

Separately or in combination, the encapsulant is formed such that the upper surface of the first segment of the interconnect clip is substantially coplanar with the a planar surface of the encapsulant, and forming the encapsulant comprises completely covering the interconnect clip with the encapsulant and subsequently planarizing the encapsulant until the upper surface of the first segment is exposed form the planar surface of the encapsulant.

An interconnect clip is disclosed. According to an embodiment, the interconnect clip comprises a first segment which at least partially encloses a central opening, a second segment vertically offset and spaced apart from the first segment, and one or more supports extending between the first segment and the second segment.

Separately or in combination, the first segment forms a closed shape around the central opening.

Separately or in combination, the first segment completely encloses the central opening.

Separately or in combination, the one or more supports extend diagonally between outer edge sides of the second segment and inner edge sides of the first segment that face the central opening.

Separately or in combination, the interconnect clip comprises a plurality of the supports extending between the first segment and the second segment, each of the supports being separated from one another by lateral gaps.

Separately or in combination, the interconnect clip includes only one of the supports extending between the first segment and the second segment.

Separately or in combination, the second segment is a planar pad with a closed shape geometry, and wherein from a plan view perspective of the interconnect clip, the support wraps around a perimeter of the second segment.

Separately or in combination, the second segment has a rectangular geometry, and from the plan view perspective of the interconnect clip, the support wraps around at least one corner of the second segment.

Separately or in combination, the support forms a complete enclosed loop extending between the outer edge sides of the second segment and inner edge sides of the first segment which face the central opening.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A, 1B and 1C, depicts an interconnect clip, according to an embodiment. FIG. 1A depicts a plan view of the interconnect clip, FIG. 1B depicts a cross-sectional view of the interconnect clip along the cross-sectional plane A-A' identified in FIG. 1A, and FIG. 1C depicts an isometric view of the interconnect clip.

FIGS. 3A and 3B, depicts an interconnect clip mounted on an assembly of a lead frame and semiconductor die, according to an embodiment. FIG. 3A depicts a plan view of the assembly, and FIG. 3B depicts a cross-sectional view of the assembly.

FIG. 5 which includes FIGS. 5A, 5B and 5C, depicts a semiconductor package that includes an interconnect clip, according to an embodiment. FIG. 5A depicts an isometric view of the upper side of the semiconductor package, FIG. 5B depicts an isometric view of the lower side of the semiconductor package, and FIG. 5C depicts a cross-sectional view of the semiconductor package.

FIG. 6, which includes FIGS. 6A and 6B, depicts a semiconductor package that includes an interconnect clip, according to another embodiment. FIG. 6A depicts an isometric view of the upper side of the semiconductor package, and FIG. 6B depicts a cross-sectional view of the semiconductor package.

FIG. 7, which includes FIGS. 7A and 7B, depicts a semiconductor package that includes an interconnect clip, according to another embodiment. FIG. 7A depicts an isometric view of the upper side of the semiconductor package, and FIG. 7B depicts an isometric view of the lower side of the semiconductor package.

FIG. 8, which includes FIGS. 8A and 8B, depicts an interconnect clip, according to an embodiment. FIG. 8A depicts a plan view of the interconnect clip, and FIG. 8B depicts a cross-sectional view of the interconnect clip along the cross-sectional plane B-B' identified in FIG. 8A.

FIGS. 9A, 9B, 9C and 9D depicts a semiconductor package that includes the interconnect clip of FIG. 8, according to an embodiment. FIG. 9A depicts a plan view of an upper side of the semiconductor package, FIG. 9B depicts a side view of the semiconductor package, FIG. 9C depicts an isometric view of the upper side of the semiconductor package, and FIG. 9D depicts a close-up isometric view of the interface between the interconnect clip and the semiconductor die.

DETAILED DESCRIPTION

Embodiments of an interconnect clip that provides advantageous top side cooling capability in a semiconductor package and ease of incorporation into a semiconductor package are described herein. The interconnect clip has a multi-level configuration with first and second planar segments that are vertically offset from one another. In an embodiment, the first planar segment forms a closed shape (e.g., a ring shape) around a central opening, the second planar segment is disposed below the central opening, and discrete support structures extend between the first and second planar segments with lateral gaps provided between the support structures. The interconnect clip can be incorporated into a semiconductor package with the second segment mounted flush against an upper surface of a semiconductor die and with the first segment exposed at an upper side of the package encapsulant body. The exposed first segment can provide an interface to transfer heat away from the top side of the package via a heat sink, for example. Additionally, the interconnect clip can provide an electrical connection between a bond pad on the upper surface of the semiconductor die and a package lead or contact.

The multi-level design of the interconnect clip advantageously allows for a large exposed surface area of conductive metal at an upper surface of the package. Due to the lateral stability provided by the second planar segment in combination with the truss-like configuration of the support structures, the interconnect clip can accommodate a large sized first segment when mounted on the semiconductor die. As a result, a semiconductor package that includes the interconnect clip can have an exposed conductive surface at the upper side of the package that extends outside of the die footprint in every direction and comes close to the outer sides of the package Moreover, various features of the interconnect clip are configured to interact with liquified mold compound in a way that maintains the stability of the interconnect clip during encapsulation. In particular, the interconnect clip is designed to cause liquified mold compound to flow evenly through lateral gaps between the support structures. This liquified mold compound pools in a central region of the package and interacts with interior edge sides of the central opening in the first segment. As a result, the interconnect clip remains level and flush against the semiconductor die during encapsulation, and the first segment remains aligned with an upper plane of the package. Hence, costly and time-consuming measures to secure the interconnect clip such as welding are avoided.

Figure 1:
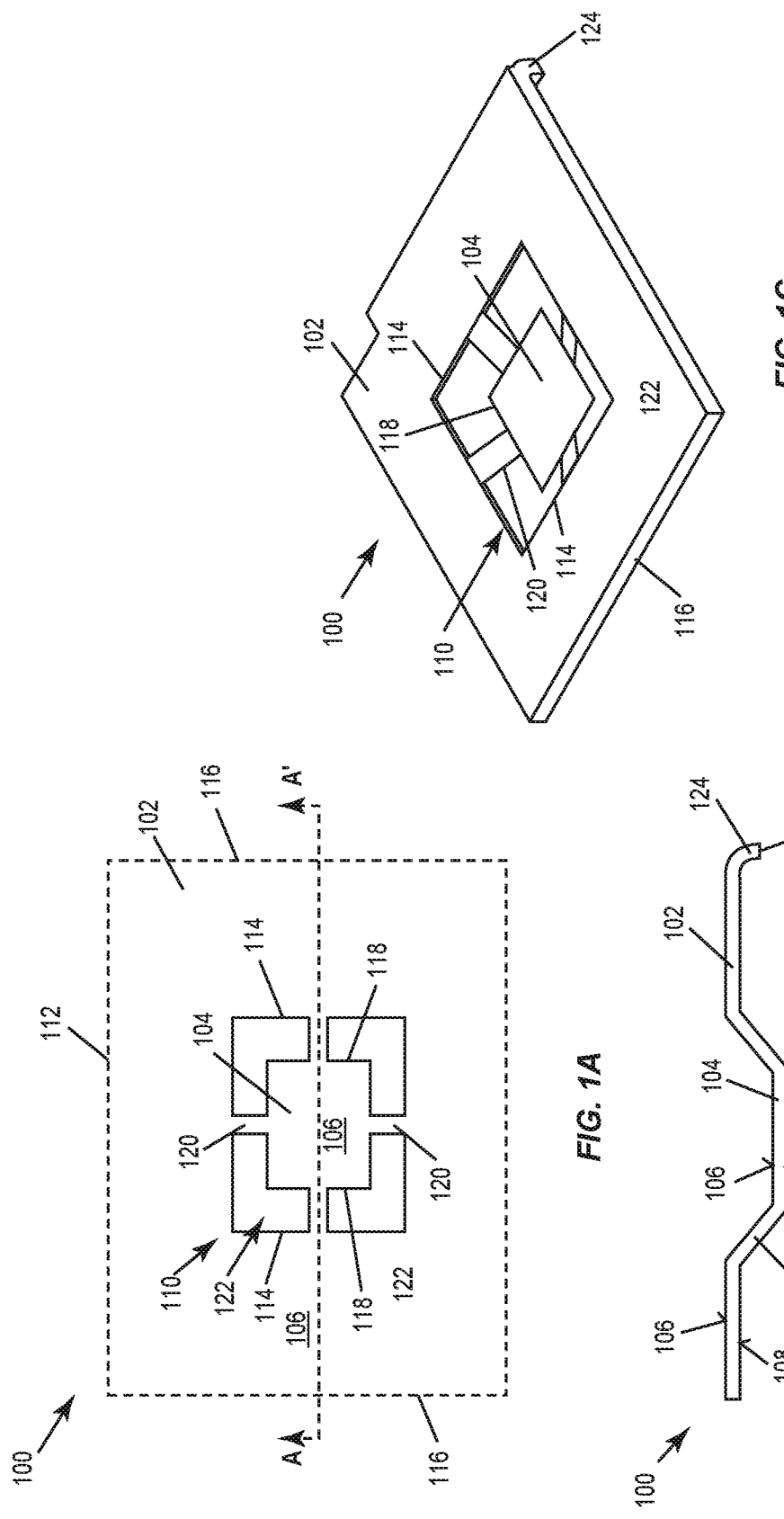
FIG. 1, which includes

Referring to FIG. 1, an interconnect clip 100 is depicted, according to an embodiment. The interconnect clip 100 includes a first segment 102 and a second segment 104. The first segment 102 and second segment 104 each include opposite facing upper and lower surfaces 106, 108. According to an embodiment, the first segment 102 and the second segment 104 are planar pads of substantially uniform thickness. The second segment 104 is vertically spaced apart from the first segment 102. This means that at least some separation distance is provided between the lower surface 108 of the first segment 102 and the upper surface 106 of the second segment 104.

According to an embodiment, the first segment 102 at least partially encloses a central opening 110. This means that an open passage is provided between the upper and lower surfaces 106, 108 of the first segment 102 at some location that is within an outer perimeter 112 of the first segment 102. Inner edge sides 114 of the first segment 102 face the central opening 110. These inner edge sides 114 extend between the upper and lower surfaces 106, 108 of the first segment 102 and are opposite from outer edge sides 116 of the first segment 102 which define the outer perimeter 112 of the first segment 102.

According to the depicted embodiment, the first segment 102 completely encloses the central opening 110. That is, the first segment 102 forms a closed shape around the central opening 110 such that a lateral portion of the first pad separates the inner edge sides 114 from the outer perimeter 112 of the first segment 102 in every direction. Alternatively, the first segment 102 can have a variety of open shape configurations wherein at least one set of inner edge sides 114 extends to the outer perimeter 112 of the first segment 102. Examples of these open shape configurations include C-shape, U-Shape, etc.

According to an embodiment, the second segment 104 is a continuous pad with a closed shape geometry. For example, as shown the second segment 104 has a rectangular geometry. More generally, the geometry of the second segment 104 may include curved shapes, elongated shapes, etc., and may be correlated to different die and/or bond pad geometries. Moreover, embodiments of the interconnect clip 100 can include multiple discrete ones of the second segment 104.

According to the depicted embodiment, the second segment 104 is disposed directly beneath the central opening 110. Furthermore, the second segment 104 is smaller than the central opening 110. As a result, outer edge sides 118 of the second segment 104 are laterally spaced apart from the inner edge sides 114 of the central opening 110 in every direction, as shown in FIG. 1A. Alternatively, the second segment 104 can be larger than and/or laterally offset from the central opening 110. Generally speaking, the second segment 104 can be located near a lateral center of mass of the interconnect clip 100. In this way, the second segment 104 maintains lateral stability of the interconnect clip 100 when the clip is mounted on a planar surface by mitigating leverage exerted by the first planar segment 102.

The interconnect clip 100 includes supports 120 connected between the first segment 102 and the second segment 104. The supports 120 mechanically couple the first segment 102 to the second segment 104. Additionally, the supports 120 provide a thermally and electrically conductive connection between the first segment 102 and the second segment 104.

According to an embodiment, the interconnect clip 100 includes four of the supports 120. More particularly, as shown in FIG. 1, the interconnect clip 100 may include two pairs of the supports 120, with the supports 120 of each pair extending away from one another in opposite directions. This is just one example of a design that is well suited for mechanical support of the first segment 102.

According to an embodiment, the connection points between the supports 120 and the first segment 102 are laterally offset from the connection points between the supports 120 and the second segment 104. Put another way, the supports 120 do not extend exclusively in a vertical direction between the first segment 102 and the second segment 104. Instead, the supports 120 are oriented to connect at locations that are laterally closer to outer edge sides 106 of the first segment 102 than their connection point with the second segment 104. For example, in the depicted embodiment, each of the vertical supports 120 extend diagonally between the second segment 104 and the first segment 102. Alternatively, the vertical supports 120 may have one or more angled bends to achieve the laterally offset connection point. In either configuration, the outward extension of the supports 120 as they move away from the second segment 104 and toward the first segment 102 enhances structural support and stability by providing a truss-like configuration.

According to an embodiment, the supports 120 are separated from one another by lateral gaps 122. This means that at least some separation distance is provided between defined edge sides of the supports 120 that extend vertically between the second segment 104 and the first segment 102. Hence, from a side-view perspective of the interconnect clip 100 (e.g., as shown in FIG. 1B), the lateral gaps 122 provide an open passage between a region that is directly underneath the lower surface 108 of the first segment 102 and a region that is directly above the upper surface 106 of the second segment 104. The size, shape, and dimensioning of these lateral gaps 122 may vary from what is shown. Generally speaking, the arrangement, number and size of the lateral gaps 122 can be tailored to meet a variety of design factors. These design factors include ease of mold flow through the lateral gaps 122, and dimensioning requirements for the supports 120. Instead of the depicted configuration, the lateral gaps 122 can be implemented as narrow slits and/or circular openings disposed between relatively larger support structures 120.

According to an embodiment, the interconnect clip 100 includes an end connector 124. The end connector 124 is directly connected to the first segment 102 and extends away from the lower surface 108 of the first segment 102 towards an outer end 126. The outer end 126 of the end connector 124 is disposed on the same side of the first segment 102 as the second segment 104. As shown, the end connector 124 and the first segment 102 can be parts of a continuous planar structure that bends downward at one end. Alternatively, the end connector 124 may be part of separate structure that is attached to the first segment 102.

Each of the above discussed features of the interconnect clip 100 are formed from a thermally and electrically conductive material. Exemplary materials for the interconnect clip 100 include copper, aluminum, nickel, iron, zinc, etc., and alloys thereof. In any case, the materials used to form the interconnect clip 100 can be selected to provide a thermally conductive connection between the lower surface 108 of the second segment 104 and the upper surface 106 of the first segment 102. In this way, the interconnect clip 100 is configured to provide top-side cooling capability. Moreover, the materials used to form the interconnect clip 100 can be selected to provide an electrically conductive connection between the lower surface 108 of the second segment 104 and the outer end 126 of the end connector 124. In this way, the interconnect clip 100 is configured to provide electrical interconnect capability.

According to an embodiment, the interconnect clip 100 is monolithically formed from a planar sheet metal. For example, the interconnect clip 100 having the above discussed features can be provided by initially providing an undisturbed sheet of conductive metal, e.g. a flat plate of metal such as copper, aluminum, alloys thereof, etc. that is similar or identical to a metal sheet that is used to form a package lead frame. Subsequently, the planar sheet metal can be processed to form the vertically offset first and second segments 102, 104, and the central opening 110. In one embodiment, this is done by stamping or punching the planar sheet metal. The lateral gaps 122 can be formed simultaneously or separately using a stamping, punching or etching process. As a result, the first segment 102, the second segment 104 and the supports 120 are monolithically formed portions of a single piece of planar sheet metal. In an embodiment, the end connector 124 is formed by bending the planar section of the sheet metal before, during or after the above steps. Alternatively, the interconnect clip 100 can be formed by connecting two discrete conductive structures together using known techniques, e.g., soldering, welding, riveting, etc.

Advantageously, the features of the interconnect clip 100 can be tailored to match specific characteristics of a semiconductor die and/or package design. For example, according to an embodiment, the interconnect clip 100 is formed by selecting an area of the second segment 104 to be correlated to a specific semiconductor die that it will attach to in a completed semiconductor package. This means that the second segment 104 has the same general shape as the semiconductor die, e.g., square, rectangle, etc., and the lateral surface area of the second segment 104 is the same or close to (e.g., within +/−10%) the surface area of the semiconductor die. In this way, the manufacturer of the semiconductor package can provide an interconnect clip 100 that is optimally configured for mechanical stability and heat transfer with respect to a specific semiconductor die. Moreover, this tailoring can be achieved using simple processing steps, e.g., by appropriately selecting the punch/stamp size according to the above described technique for forming the interconnect clip 100. As another example, the outer perimeter 112 of the first segment 102 can be dimensioned to be close to or slightly smaller than (e.g., about 90% of a lateral surface area) of an intended package size.

Figure 2:
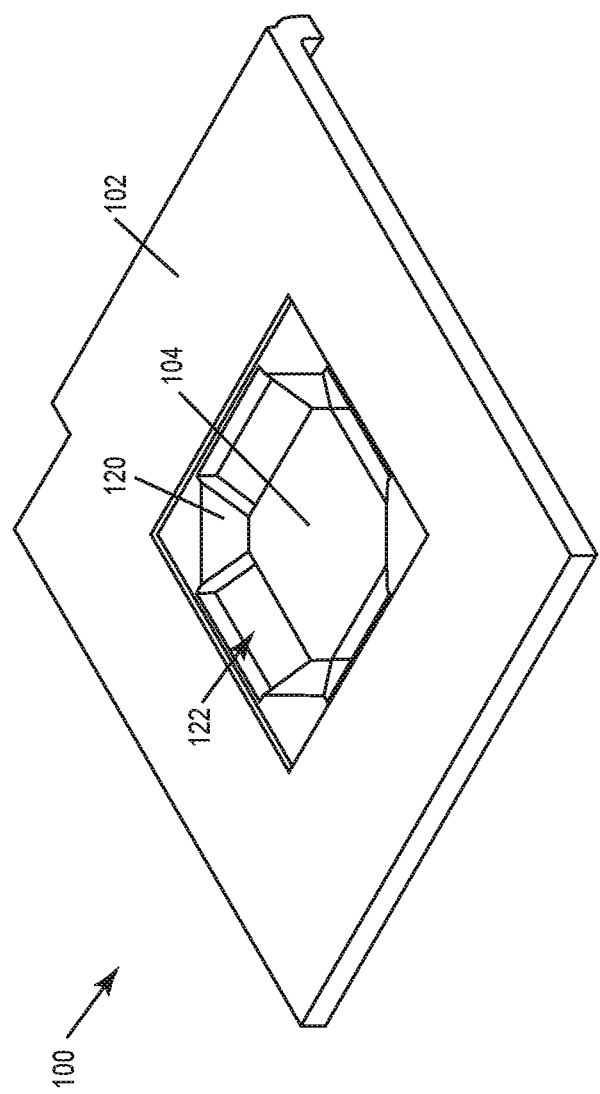
FIG. 2 depicts an isometric view of an interconnect clip, according to another embodiment.

Referring to FIG. 2, an interconnect clip 100 is shown, according to another embodiment. The interconnect clip 100 of FIG. 2 is identical to the interconnect clip 100 described with reference to FIG. 1, with the exception that the supports 120 are differently configured. In the embodiment of FIG. 2, the interconnect clip 100 also includes two pairs of the supports 120, with the supports 120 of each pair extending away from one another in opposite directions. However, the supports 120 are provided at corner locations of the second pad and the central opening 110 instead of the central connection point configuration shown in FIG. 1. Moreover, the supports 120 have a greater cross-sectional diameter in comparison to the supports 120 in the interconnect clip 100 of FIG. 1. This configuration may be desirable for greater mechanical strength and conductive capability.

More generally, the configuration of the vertical supports 120 can differ from the specific embodiments of FIGS. 1-2. The arrangement, number and size of the supports 120 can be optimized with respect to a variety of design factors, such as mechanical strength of the supports 120, conduction capability of the supports 120 (both thermal and electrical), and/or dimensioning of the lateral gaps 122 between the supports 120.

Figure 3:
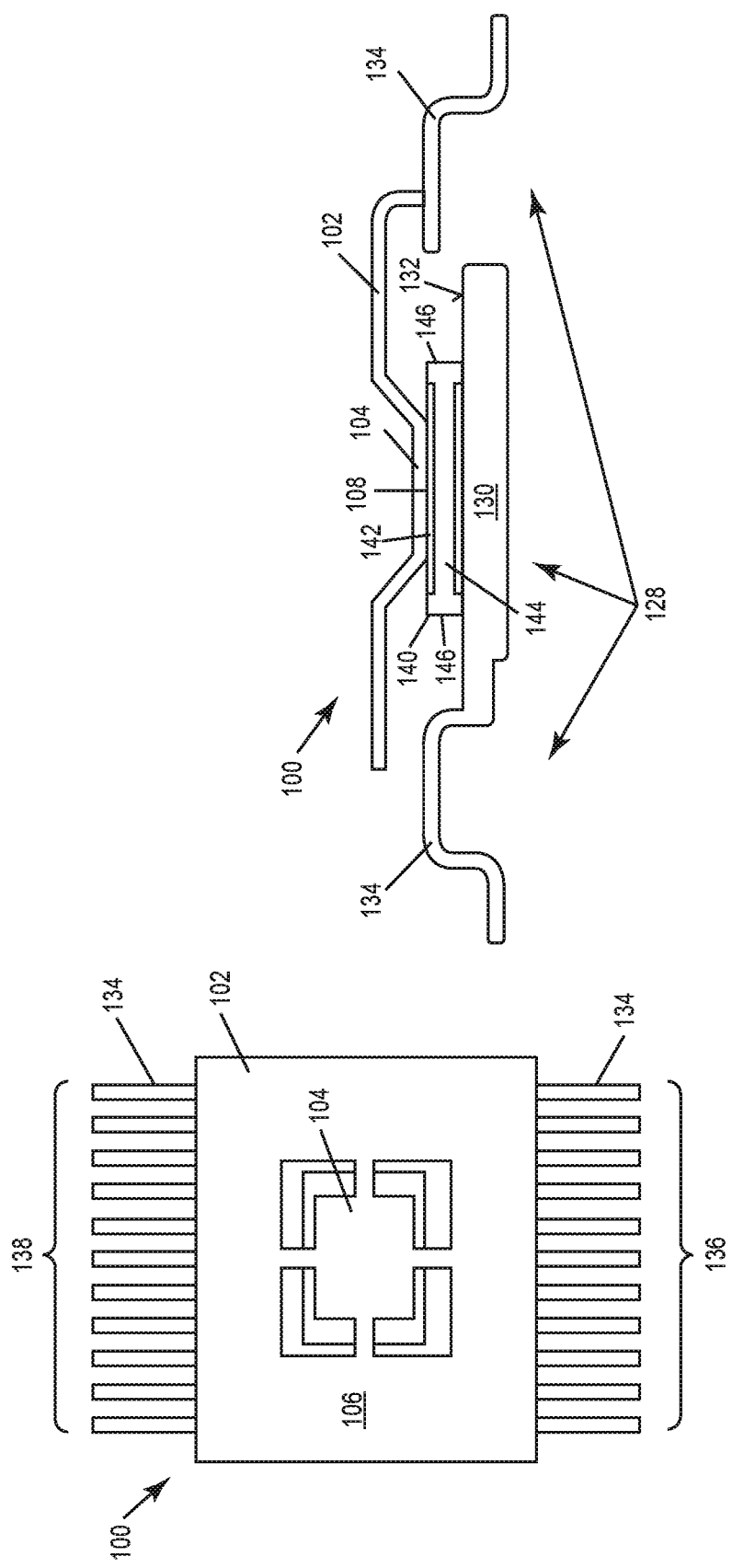
FIG. 3, which includes

Referring to FIG. 3, a selected method step for packaging a semiconductor device using the interconnect clip 100 is shown, according to an embodiment. In this method step, a lead frame 128 is provided. The lead frame 128 includes an electrically and thermally conductive material, e.g., electrically conductive material such as copper, aluminum, nickel, iron, zinc, etc., and alloys thereof. The lead frame 128 includes a die pad 130 with a die attach surface 132. Additionally, the lead frame 128 includes electrically conductive leads 134 that extend away from the die pad 130. In the depicted embodiment, a first group 136 of the leads 134 connect directly to the die pad 130, and a second group 138 of leads 134 are detached from the die pad 130. The leads 134 may be bent wherein outermost ends of the leads 134 extend substantially parallel to the bottom side of the package, wherein the leads may comprise a positive or negative stand-off.

In this method step, a semiconductor die 140 is mounted on the die attach surface 132 of the die pad 130. Generally speaking, the semiconductor die 140 can have a wide variety of device configurations, such as MOSFET (Metal Oxide Semiconductor Field Effect Transistor), IGBT (Insulated Gate Bipolar Transistor), JFET (Junction Field Effect Transistor), diode, etc. Generally speaking, the semiconductor die 140 may include any of a wide variety of semiconductor materials including type IV semiconductors, e.g., silicon, silicon germanium, silicon carbide, etc., and type III-V semiconductors, e.g., gallium nitride, gallium arsenide, etc. Generally speaking, the semiconductor die 140 may be configured as a vertical device that is configured to control a current flowing between opposite facing upper and lower surfaces, or a lateral device that is configured to control a current flowing parallel to a main surface.

According to an embodiment, the semiconductor die 140 includes a first bond pad 142 disposed on an upper surface of the semiconductor die 140 which faces away from the die attach surface 132, and a second bond pad 144 disposed on a rear surface of the semiconductor die 140 which faces the die attach surface 132. These first and second bond pads 142, 144 provide terminal connections to the semiconductor die 140. For example, the first and second bond pads 142, 144 may be load terminals, e.g., anode and cathode terminals in the case of a diode, or source/drain or collector/emitter terminals in the case of a switching device. For simplicity sake, only two bond pads are shown. In practice, the semiconductor die 140 may include additional bond pads, such as a control terminal, e.g., gate, base, etc., in the case of a three terminal switching device. These additional bond pads can be connected to the leads 134 using known techniques.

In this method step, the interconnect clip 100 is mounted on top of the semiconductor die 140. According to an embodiment, the interconnect clip 100 is mounted such that the lower surface 108 of the second segment 104 is flush against the upper surface of the semiconductor die 140. This means that the lower surface 108 of the second segment 104 is substantially parallel to the upper surface of the semiconductor die 140 and these two surfaces are mechanically coupled to one another, e.g., by direct contact or by an intermediary, e.g., solder, sinter, adhesive, etc.

According to an embodiment, the interconnect clip 100 is mounted such that lower surface 108 of the second segment 104 is conductively connected (electrically and thermally) to the first bond pad 142. This conductive connection can be effectuated by direct physical contact between the two surfaces, or by a conductive joining material, e.g., solder, sinter, conductive glue, etc.

According to an embodiment, the interconnect clip 100 is mounted such that the outer end 126 of the end connector 124 directly electrically contacts a first lead 134 from the lead frame 128. This conductive connection can be effectuated by direct physical contact between the two surfaces or by a conductive joining material, e.g., solder, sinter, conductive glue, etc. As a result of this connection and a connection between the second segment 104 and the first bond pad 142 as described above, the interconnect clip 100 provides a direct electrical connection between the first bond pad 142 and the first lead 134.

According to an embodiment, when mounted, the interconnect clip 100 laterally overhangs past the outer edge sides 146 of the semiconductor die 140 in every direction. This means that the outer edge sides 146 of the semiconductor die 140 are located completely inside of the lateral footprint of the first segment 102, as defined the outer perimeter 112 of the first segment 102. This configuration is different from conventional interconnect clip 100 configurations wherein the clip provides a direct point-to-point connection between two terminals (e.g., a bond pad and a lead) and thus only extends over one edge side of a semiconductor die. While the mounted interconnect clip 100 can provide a similar point-to-point connection between the first bond pad 142 and the first lead 134, portions of the first segment 102 are disposed outside of the current flow path between the first bond pad 142 and the first lead 134. For example, a leftmost section of the first segment 102 in FIG. 3 is disposed outside of the current path.

Figure 4:
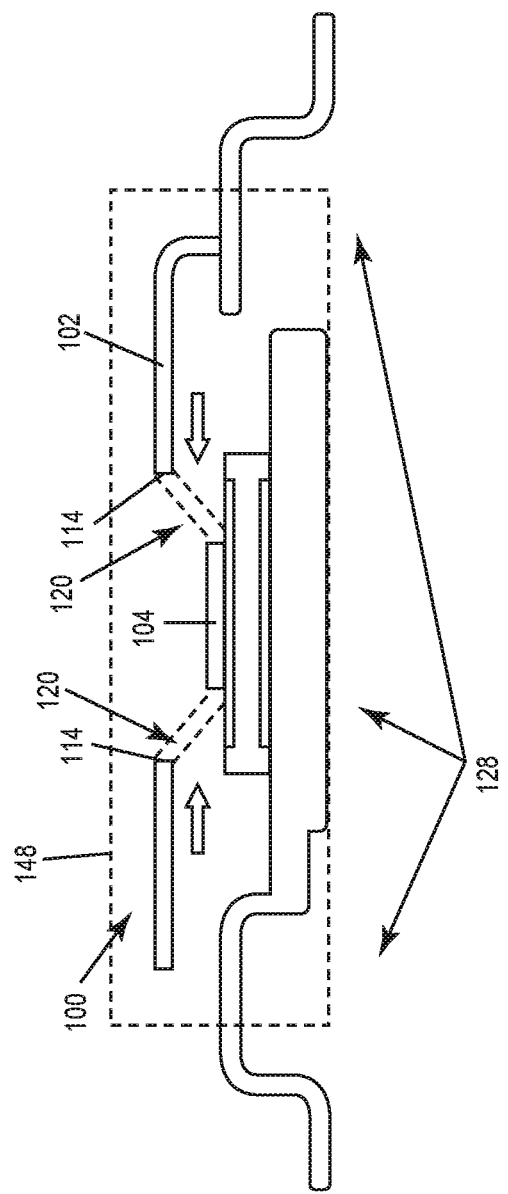
FIG. 4 depicts the flow of liquified mold compound in an interconnect clip mounted assembly during an encapsulation process, according to an embodiment.

Referring to FIG. 4, a selected method step for packaging a semiconductor device using the interconnect clip 100 is shown, according to an embodiment. In this method step, the assembly of FIG. 3 is encapsulated with an electrically insulating material using a molding process. Exemplary techniques for this molding process include injection molding, compression molding, transfer molding, to name a few. In these techniques, the assembly is placed inside the cavity 148 of a mold tool, and the cavity is filled with a liquified molding material. Examples of these molding materials include ceramics, epoxy materials, thermosetting plastics, to name a few. The liquified molding material fills the cavity 148 so as to form the desired shape of a package body. Subsequently, the liquified molding material hardens, and package is removed from the mold cavity 148.

According to an embodiment, the liquified molding material flows through each of the lateral gaps 122 during the formation of the encapsulant. More particularly, the liquified molding material can flow in a lateral direction that points towards the central opening 110. This directional flow of the liquified molding material is depicted by the arrows in FIG. 4. As the liquified molding material continues to flow, it covers the second segment 104, and eventually reaches the interior edge sides 114 of the first segment 102 until the central section of the encapsulant as previously described is formed.

Advantageously, the features of the interconnect clip 100 are designed to maintain stability of the interconnect clip 100 and to cause the liquified molding material to flow evenly and uniformly during the above described molding process. In particular, the lateral gaps 122 enable a relatively uniform flow of the molding material over the second segment 104. Once covered with molding material, the second segment 104 acts as a footing that maintains the interconnect clip 100 in place. Moreover, the interior edge sides 114 of the first segment 102 provide a contact surface that engages with the liquified molding material as it pools in the central opening 110. This allows the mold compound to fill evenly and maintain the first segment 102 at a relatively planar position that is parallel to the upper surface of the semiconductor die 140.

Referring to FIG. 5, a completed semiconductor package 200 is depicted, according to an embodiment. The semiconductor package 200 includes a body of encapsulant 202 that may be formed according to the above described technique. The encapsulant 202 is formed to completely cover the semiconductor die 140, with outer ends of the leads 134 exposed from in a commonly known manner.

According to an embodiment, the encapsulant 202 is formed such that the upper surface 106 of the first segment 102 of the interconnect clip 100 is exposed from an upper surface 204 of the encapsulant 202. This means that at least a portion of the upper surface 106 of the first segment 102 is uncovered from the encapsulant 202 material and hence available for contact with a heat dissipation mechanics, e.g., a heat sink and/or a thermal interface material. As shown, the upper surface 106 of the first segment 102 is completely uncovered such that the complete shape of the first segment 102 (an enclosed ring in this case) is exposed from the encapsulant 202. This configuration can be achieved by appropriately dimensioning the mold cavity in the above described molding techniques. Alternatively, this configuration can be achieved by a two-step process, wherein the encapsulant 202 is initially formed to completely cover the interconnect clip 100, and the upper surface 204 of the encapsulant 202 is subsequently planarized (e.g. by polishing or grinding) until the upper surface 106 of the first segment 102 is exposed from the encapsulant 202.

According to an embodiment, the encapsulant 202 is formed such that the upper surface 106 of the first segment 102 is substantially coplanar with the upper surface 204 of the encapsulant 202. This means that the upper surface 106 of the first segment 102 and the upper surface 204 of the encapsulant 202 collectively form a continuous planar surface that provides an upper side of the packaged device. In other embodiments, the interconnect clip 100 can protrude out of encapsulant 202 such that the upper surface 106 of the first segment 102 is vertically offset from the upper surface 106 of the first segment 102.

According to an embodiment, the upper surface 106 of the first segment 102 is substantially parallel to the lower surface 108 of the second segment 104. This configuration orients the upper surface 106 of the first segment 102 along a vertical plane that is parallel to and spaced apart from the upper surface of the semiconductor die 140 when the interconnect clip 100 is mounted, e.g., as shown in FIG. 3. Hence, when the encapsulant 202 is formed, e.g., as described in FIG. 4, the upper surface 106 of the first segment 102 is positioned to be coplanar with the upper surface 204 of the encapsulant, 202.

According to an embodiment, the upper surface 106 of the first segment 102 that is exposed from the encapsulant 202 laterally extends past outer edge sides 146 of the semiconductor die 140 in every direction. This means that outer edge sides 146 of the semiconductor die 140 are laterally contained within the perimeter of the exposed conductive material of the first segment 102.

According to an embodiment, the encapsulant 202 includes a central portion 206 that directly interfaces with the interior edge sides 114 of the first segment 102. The central portion 106 of the encapsulant 202 extends to the upper surface 204 of the encapsulant 202, which may be coplanar with the upper surface 106 of the first segment 102 and/or the upper surface 204 of the encapsulant 202 outside of the perimeter of the first segment 102. According to an embodiment, the central portion 206 of the encapsulant 202 completely covers the upper surface 106 of the second segment 104.

The semiconductor package 200 of FIG. 5 can be mounted on a carrier, such as a printed circuit board in a commonly known manner. The carrier may include a socket with a heat sink that accommodates the semiconductor package 200 and interfaces with the die pad 130 when mounted. A second heat sink can be mounted on top of the semiconductor package 200. The interconnect clip 100 provides a conductive transmission path for heat to be pulled away from the top of the package via the second heat sink. Due to the advantageous large exposed surface area of the interconnect clip 100 as described above, highly efficient transfer of heat may occur.

Referring to FIG. 6, a semiconductor package 200 that includes the interconnect clip 100 is depicted, according to another embodiment. The semiconductor package 200 in the embodiment of FIG. 6, is configured identically to the semiconductor package 200 of FIG. 5, except that it additionally includes a heat slug 208. The heat slug 208 is a discrete piece of thermally conductive material, e.g., a metal such as copper, aluminum, alloys, etc., and alloys thereof. A bottom surface of the heat slug 208 is attached to the upper surface 106 of the second segment 104, e.g., by a conductive adhesive such as solder, sinter, tape, etc. The heat slug 208 extends to the upper surface of the encapsulant 202 such that an upper surface of the heat slug 208 is exposed inside of the central opening 110. According to an embodiment, the upper surface of the heat slug 208 is substantially coplanar with the upper surface 204 of the encapsulant 202 and/or the upper surface 106 of the first planar segment 102. In this example, the central portion 206 of the encapsulant 202 fills a region between the heat slug 208 and the interior edge sides 114 of the first segment 102. The combination of the heat slug 208 with the interconnect clip 100 described may be preferred in some application to provide further heat dissipation.

Referring to FIG. 7, a semiconductor package 200 is depicted, according to another embodiment. The semiconductor package 200 is identical to the semiconductor package 200 described with reference to FIG. 5, with the exception of the lead configuration. The semiconductor package 200 of FIG. 7 is configured as a "leadless" or "no-lead" package. According to this design, the package includes contacts 210 that are coplanar with a surface of the encapsulant 202 material instead of leads 134 that protrude out of the package body. These contacts 210 are electrically connected to the terminals of the semiconductor die 140 in a similar manner as described above with respect to the leads 134, and hence provide package level connection terminals. The interconnect clip 100 described herein may be used to provide a connection with one of these contacts 210. Alternatively, the interconnect clip 100 described herein can be provided exclusively as a heat dissipation feature.

Referring to FIG. 8, an interconnect clip 100 is depicted, according to another embodiment. The interconnect clip 100 of FIG. 8 includes a first segment 102 that encloses a central opening 110, and a second segment 104 that is below the central opening 110 and is vertically separated from the first segment 102 by a support 120. Each of these features may have the same properties (e.g., geometry, arrangement, material composition, etc.) as the correspondingly identified features in the previously discussed embodiments, with the exception of the following differences that will be discussed below.

In a first difference between the previously discussed embodiments, the interconnect clip 100 of FIG. 8 includes only a single support 120 connected between the first segment 102 and the second segment 104. When seen from the plan view perspective of FIG. 8A, the support 120 at least partially encloses the second segment 104. That is, the support 120 is a continuous structure that wraps around the perimeter of the second segment 104. Thus, different to the previously described embodiments, the interconnect clip 100 does not include multiple lateral gaps 122 between multiple discrete supports 120.

According to the depicted embodiment, the support 120 wraps around the entire perimeter of the second segment 104. That is, the support 120 forms a complete enclosed loop which fully surrounds and adjoins the second segment 104. Moreover, the support 120 fully reaches and adjoins the inner edge sides 114 of the first segment 102 which face the central opening 110, Hence, the second segment 104 and the support 120 are collectively configured as a closed depression that extends downward from the first segment 102.

In other embodiments, the support 120 can have a variety of open shape configurations e.g., C-shape, U-Shape, etc. In any case, the support 120 may continuously wrap around a significant percentage of the perimeter of the second segment 104. For example, the support 120 may continuously contact at least 50%, 75%, 95%, or more of an overall length of the perimeter of the second segment 104. In angular terms, the support 120 may enclose at least 180°, 270°, 330° or more second segment, as seen from a center of the second segment 104. In the case that the second segment 104 has acute corners, e.g., in the case of rectangle, the support may wrap around at least one of these corners.

In a second difference between the previously discussed embodiments, the first segment 102 of the interconnect clip 100 of FIG. 8 has a different geometry when seen from the plan view perspective of FIG. 8. In the depicted example, the first segment 102 has an L-shaped geometry refers to a geometry with two rectangular portions intersecting one another. More generally, the first segment 102 can have a wide variety of geometries. For example, the first segment 102 may include rounded portions. In another example, the first segment 102 can have a substantially square-shaped geometry as depicted in the embodiment of FIG. 1. The selection of a particular geometry for the first segment 102 may depend upon design considerations such as package type, die size, lead configuration, etc.

The interconnect clip 100 of FIG. 8 may be formed according to the following technique. Initially, a planar sheet metal, e.g. a flat plate of metal such as copper, aluminium, alloys thereof, etc., is provided. Subsequently, the planar sheet metal is shaped to form the desired geometry of the first planar portion, e.g., an L-shaped geometry in the depicted example. This may be done using cutting and/or stumping techniques, for example. Subsequently, an embossing process is performed. The embossing process offsets a section of the planar sheet metal corresponding to the desired shape of the second segment 104. The deflected portions of the planar sheet metal which extend to the second segment 104 correspond to the support 120. This embossing process can be performed using known stamping or punching techniques, for example. Generally speaking, the depth of the embossing can be selected to ensure adequate vertical separation between the upper surface 106 of the second segment 104 and the upper surface 106 of the first segment 102. More specifically, the embossing can be performed to ensure that the upper surface 106 of the second segment 104 remains covered during polishing or grinding of an encapsulant, e.g., according to a technique to be described below. Exemplary values for this vertical offset may be in the range of 200 μm–1,000 μm. Alternatively, the interconnect clip 100 of FIG. 8 may be formed by initially performing the embossing process and subsequently shaping the sheet metal, e.g., by cutting and/or stumping.

As shown, the location of the embossing is selected such that a single point location of the central opening 114 (a corner in this case) meets an inner corner 150 of the L-shaped first segment 102. More generally, the location and size of the embossing can be selected to meet a variety of design considerations, e.g., chip size, bond pad configuration, etc.

One advantage of the interconnect clip 100 of FIG. 8 is enhanced thermal transmission between the second segment 104 and the first segment 102. In any of the embodiments described herein, the support 120 or supports 120 represent a bottleneck point in the thermal conduction path of the interconnect clip 100. Accordingly, during operation, the highest temperatures may occur within the supports 120 and/or in the vicinity of the transition between the supports 120 and the first and second segments 102, 104. The design of the support 120 in the interconnect clip 100 of FIG. 8 advantageously spreads out this bottleneck point across a large cross-sectional diameter. By way of comparison, the multiple discrete support structures 120 in the previously described embodiments of the interconnect clip 100, while advantageous for other considerations (e.g., enhanced mold-adhesion), restrict the thermal conduction path to narrower cross-sectional diameters, thereby limiting thermal transmission.

Another advantage of the interconnect clip 100 of FIG. 8 is ease of manufacture. Because the second segment 104, the first segment 102 and the support 120 can be formed as integral parts of a single piece of sheet metal, minimal processing steps are required. Specifically, only the embossing step as described above (e.g., punching or stamping) is necessary to form the second segment 104 and support 120 with the described geometry and relationship to the first segment 102. This embossing step can easily form a contact pad that can form complete or near complete contact with the die surface. Any burr produced by the stumping process does not contact the die, due to the production of the depression, i.e., the second segment 104. Moreover, cutting and/or stumping techniques used to shape the interconnect clip can easily produce an interconnect clip 100 of any desired geometry.

Figure 9:
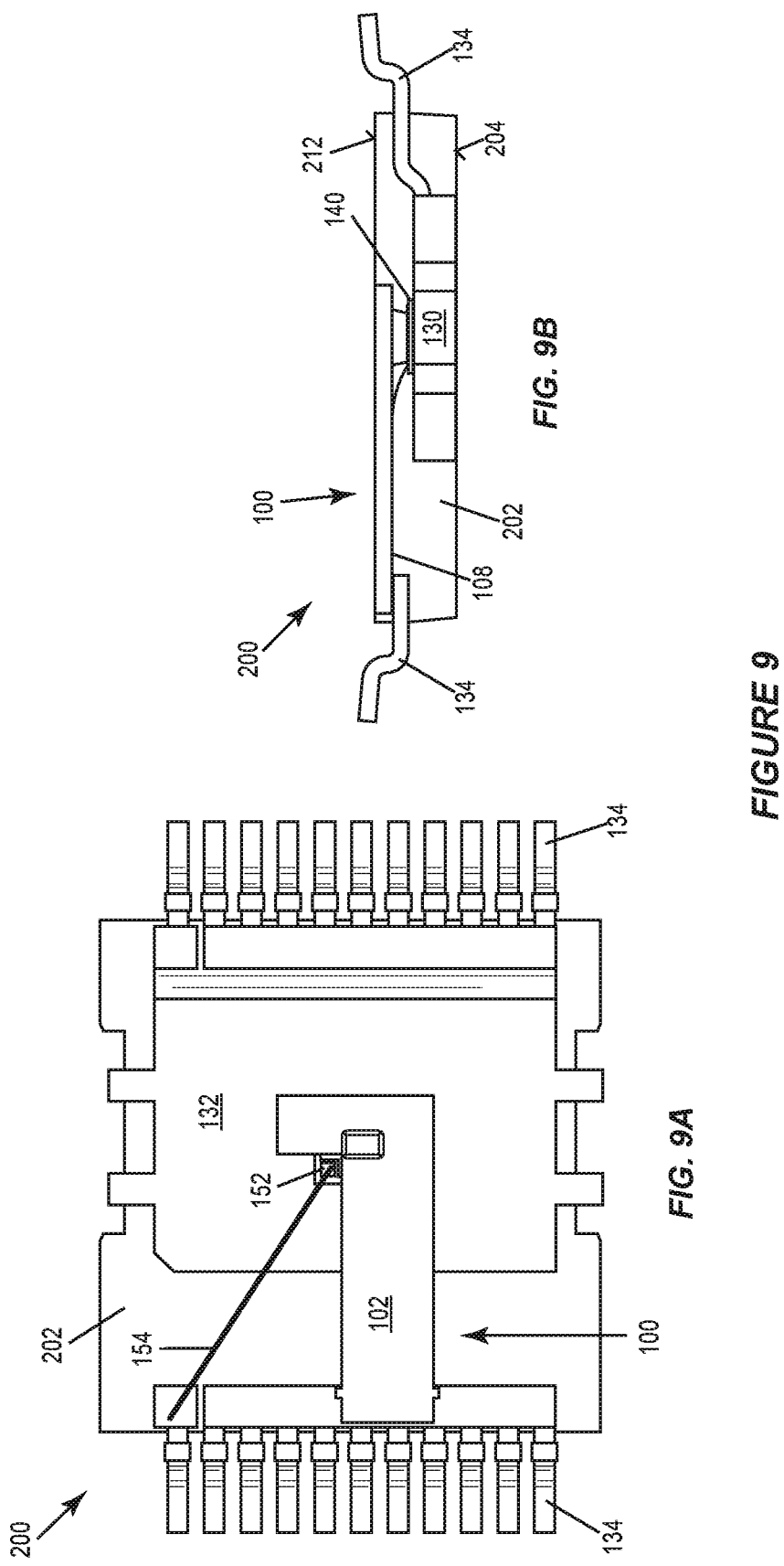
FIG. 9, which includes

Referring to FIG. 9, a semiconductor package 200 that includes the interconnect clip 100 from the embodiment of FIG. 8 is depicted, according to an embodiment. In FIG. 9, the encapsulant 202 is depicted as translucent so that the interior features of the semiconductor package 200 can be seen. The semiconductor package 200 includes a die pad 130, electrically conductive leads 134, and a semiconductor die 140. Each of these features may be similar or identical to the correspondingly identified features in the semiconductor package 200 described with reference to FIG. 5. The semiconductor die 140 is mounted on a die attach surface 132 of the die pad 130 with a first bond pad 142 facing away from the die attach surface 132 in a similar manner as previously described.

The interconnect clip 100 is mounted with the second segment 104 being flush against the semiconductor die 140 and electrically connected to the first bond pad 142 in a similar manner as previously described. An opposite end of the interconnect clip 100 in the first segment 102 contacts a pad segment of the lead frame 128 which is connected to multiple ones of the leads 134. In both connections, a conductive joining material such as solder, sinter, conductive glue, etc., may be provided between the two surfaces to form a reliable mechanical and electrical connection. Different to the embodiment of FIG. 5, the leads 134 of the package of FIG. 9 are vertically offset from the die pad 130. As a result, the interconnect clip 100 can directly contact these offset leads at the lower surface 108 of the first planar portion 102. Alternatively, if a vertical drop is needed to effectuate this electrical connection, the end of the first segment 102 may include a structure similar or identical to the end connector 124 as previously described.

As shown in FIGS. 9C and 9D, the geometry of the second planar portion 102 mirrors that of the first bond pad 142 of the semiconductor chip, i.e., a substantially rectangular shape with a small notch in the lower corner. As the first bond pad 142 occupies a substantial majority of the upper surface area of the semiconductor die 140 (e.g., at least 90% of the overall area), the geometry of the second planar portion 104 is thus adapted for maximal heat extraction capability. Meanwhile, the semiconductor die 140 includes a second bond pad 152 which is outside of the footprint of the interconnect clip 100. The second bond pad 152 may be a control terminal of the semiconductor die, e.g., gate terminal, base terminal, etc. The second bond pad 152 may be electrically connected to a separate one of the leads 134, which is isolated from the leads to which the interconnect clip 100 is connected to, by an electrically conductive bond wire 154. The L-shaped configuration of the interconnect clip 100 enables access to the second bond pad 152 to effectuate this electrical connection before or after mounting the interconnect clip 100.

Different to the embodiment described with reference to FIG. 5, the semiconductor package 200 of FIG. 9 is configured such that the interconnect clip 100 is exposed at a lower side 212 of the encapsulant 202 (identified in FIG. 9D) which corresponds to an interface side of the package 200. The interface side refers to the side wherein the leads 134 extend at least to the plane of the encapsulant, thereby enabling the package to be mounted and electrically connected to a substrate, e.g., PCB. In this arrangement, the interconnect clip 100 acts as a bottom side cooling feature, which may be mated with a heat sink mechanism in the substrate. Meanwhile, the die pad 130 is exposed at the upper surface 204 of the encapsulant (identified in FIG. 9D), and may be mated with a second, top-side connected heat sink structure. Hence, the cooling side of the interconnect clip 100 is reversed in comparison to the embodiment of FIG. 5. More generally, any one of the embodiments of the interconnect clip 100 described Referring to FIG. 10, the semiconductor package 200 of FIG. 9 is depicted with the encapsulant 202 being opaque. The encapsulant 202 have a similar configuration as the previously described embodiments, wherein the encapsulant 202 completely covers the semiconductor die 140, and the upper surface 106 of the first segment 102 of the interconnect clip 100 is exposed from an upper surface 204 of the encapsulant 202. The upper surface 106 of the first segment 102 is exposed from the encapsulant 202. In the depicted embodiment, the upper surface 106 of the first segment 102 is substantially coplanar with the lower side 212 of the encapsulant 202.

Figure 10:
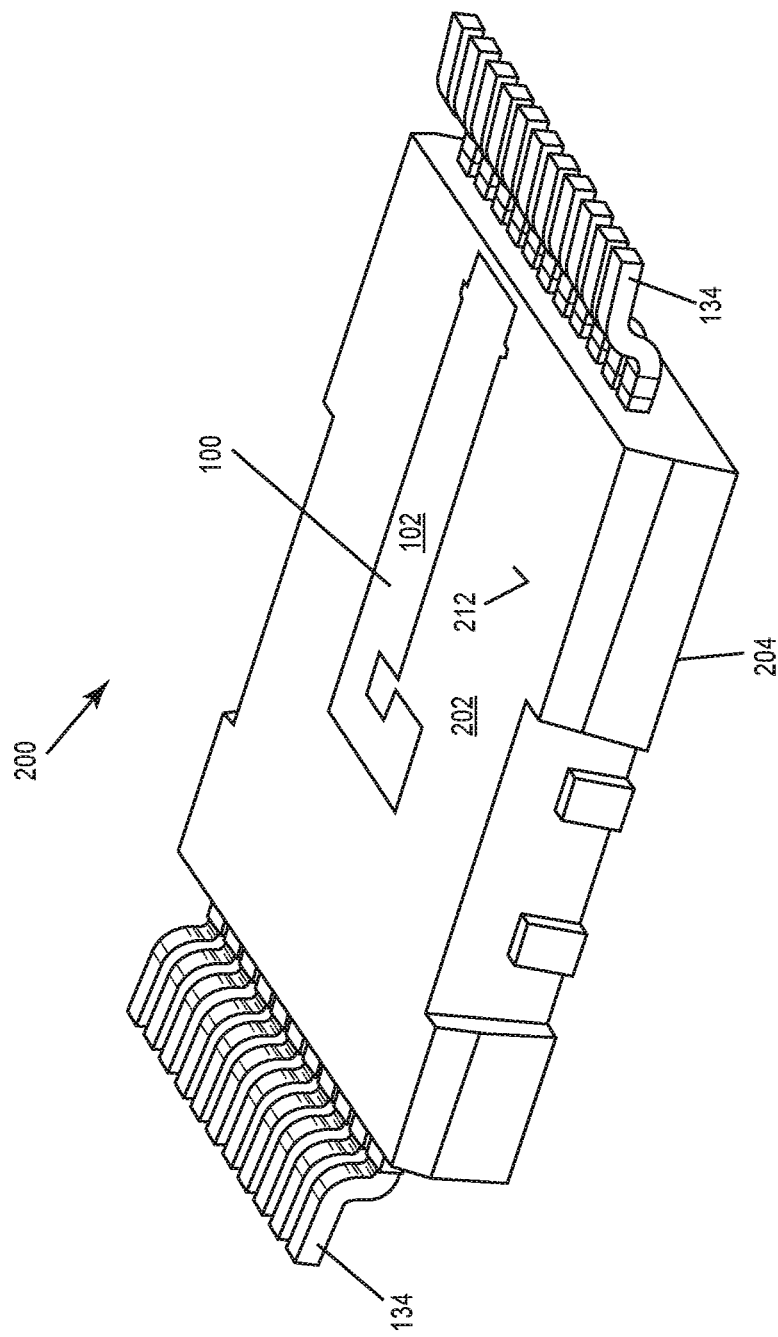
FIG. 10 depicts an isometric view of semiconductor package that includes the interconnect clip of FIG. 8, according to an embodiment.

According to an embodiment, the encapsulant 202 of the semiconductor package of FIG. 10 is formed by a two-step process, wherein the encapsulant 202 is initially formed to completely cover the interconnect clip 100, and the lower side 212 of the encapsulant 202 of the encapsulant 202 is subsequently planarized (e.g. by polishing or grinding) until the upper surface 106 of the first segment 102 is exposed from and substantially coplanar with the encapsulant 202.

Similar to the previously described embodiments, the interconnect clip 100 in the package of FIG. 10 provides a highly electrically conductive transmission path between the semiconductor die 140 and the leads 134. Meanwhile, the interconnect clip 100 provides a highly thermally conductive transmission path the exposed upper surface 106 of the first segment 102, which allows for efficient heat extraction.

More generally, the concepts described herein are applicable to a wide variety of package configurations. Generally speaking, these package configurations include any package design wherein heat dissipation is desirable at the upper surface of the semiconductor die and/or wherein the semiconductor die includes at least one upward facing bond pad that requires electrical connection. Examples of these package configurations include leaded packages, leadless packages, chip carrier packages, surface mount packages, stacked die packages, molded packages, cavity packages, etc.

The term "substantially" as used herein encompasses absolute conformity with the specified requirement as well as minor deviations from absolute conformity with the requirement due to manufacturing process variations, assembly, and other factors that may cause a deviation from the design goal. Provided that the deviation is within process tolerances so as to achieve practical conformity and the components described herein are able to function according to the application requirements, the term "substantially" encompasses any of these deviations.

The term "electrically connected," "directly electrically connected" and the like as used herein describes a permanent low-impedance connection between electrically connected elements, for example a direct contact between the relevant elements or a low-impedance connection via a metal and/or a highly doped semiconductor.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
a die pad comprising a die attach surface;
a semiconductor die mounted on the die attach surface and comprising a first bond pad and a second bond pad at an upper surface of the semiconductor die facing away from the die attach surface;
an interconnect clip, comprising:
a first segment which at least partially encloses a central opening;
a second segment vertically offset and spaced apart from the first segment; and
a support extending between the first segment and the second segment; and
an electrically insulating encapsulant covering the semiconductor die,
wherein an upper surface of the first segment of the interconnect clip is exposed from a planar surface of the encapsulant,
wherein a lower surface of the second segment is flush against the upper surface of the semiconductor die and conductively connected to the first bond pad, and
wherein from a plan view perspective of the interconnect clip the second bond pad is outside of a footprint of the interconnect clip.

2. The semiconductor package of claim 1, wherein the second segment is a planar pad with a closed shape geometry, and wherein from a plan view perspective of the interconnect clip, the support wraps around a perimeter of the second segment.

3. The semiconductor package of claim 2, wherein the second segment has a rectangular geometry, and wherein from the plan view perspective of the interconnect clip, the support wraps around at least one corner of the second segment.

4. The semiconductor package of claim 2, wherein the support forms a complete enclosed loop extending between the outer edge sides of the second segment and inner edge sides of the first segment which face the central opening.

5. The semiconductor package of claim 1, wherein from the plan view perspective of the interconnect clip, the interconnect clip has an L-shaped geometry.

6. A method of packaging a semiconductor device, the method comprising:
providing a die pad comprising a die attach surface;
providing a semiconductor die comprising a first bond pad and a second bond pad on an upper surface of the semiconductor die;
mounting the semiconductor die on the die pad such that the first bond pad faces away from the die attach surface;
providing an interconnect clip that comprises:
a first segment which at least partially encloses a central opening;
a second segment vertically offset and spaced apart from the first segment; and
a support extending between the first segment and the second segment;
mounting the interconnect clip on the semiconductor die such that a lower surface of the second segment is flush against the upper surface of the semiconductor die and conductively connected to the first bond pad; and
forming an electrically insulating encapsulant such that the semiconductor die is covered by the encapsulant and such that an upper surface of the first segment of the interconnect clip is exposed from an upper surface of the encapsulant, and
wherein from a plan view perspective of the interconnect clip the second bond pad is outside of a footprint of the interconnect clip.

7. The method of claim 6, wherein the second segment is a planar pad has a closed shape geometry, and wherein from a plan view perspective of the interconnect clip, the first segment wraps around a perimeter of the second segment.

8. The method of claim 6, wherein the encapsulant is formed such that the upper surface of the first segment of the interconnect clip is substantially coplanar with the upper surface of the encapsulant, and wherein forming the encapsulant comprises completely covering the interconnect clip with the encapsulant and subsequently planarizing the encapsulant until the upper surface of the first segment is exposed form the planar surface of the encapsulant.

9. The method of claim 6, wherein from the plan view perspective of the interconnect clip, the interconnect clip has an L-shaped geometry.

10. An interconnect clip, comprising:
a first segment which at least partially encloses a central opening;
a second segment vertically offset and spaced apart from the first segment; and
one or more supports extending between the first segment and the second segment,
wherein from a plan view perspective of the interconnect clip, the interconnect clip has an L-shaped geometry, and
wherein the first segment comprises a first elongated span and a second elongated span that intersects with the first elongated span, and wherein the first elongated span and the second elongated span form an inner corner of an outer edge of the interconnect clip, wherein the central opening meets the inner corner.

11. The interconnect clip of claim 10, wherein the one or more supports extend diagonally between outer edge sides of the second segment and inner edge sides of the first segment that face the central opening.

12. The interconnect clip of claim 10, wherein the interconnect clip comprises a plurality of the supports extending between the first segment and the second segment, each of the supports being separated from one another by lateral gaps.

13. The interconnect clip of claim 10, wherein the interconnect clip includes only one of the supports extending between the first segment and the second segment.

14. The interconnect clip of claim 13, wherein the second segment is a planar pad with a closed shape geometry, and wherein from a plan view perspective of the interconnect clip, the support wraps around a perimeter of the second segment.

15. The interconnect clip of claim 14, wherein the second segment has a rectangular geometry, and wherein from the plan view perspective of the interconnect clip, the support wraps around at least one corner of the second segment.

16. The interconnect clip of claim 14, wherein the support forms a complete enclosed loop extending between the outer edge sides of the second segment and inner edge sides of the first segment which face the central opening.

* * * * *